US007015147B2

(12) United States Patent
Lee et al.

(10) Patent No.: US 7,015,147 B2
(45) Date of Patent: Mar. 21, 2006

(54) FABRICATION OF SILICON-ON-NOTHING (SON) MOSFET FABRICATION USING SELECTIVE ETCHING OF $SI_{1-X}GE_X$ LAYER

(75) Inventors: Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 288 days.

(21) Appl. No.: 10/625,065

(22) Filed: Jul. 22, 2003

(65) Prior Publication Data
US 2005/0020085 A1 Jan. 27, 2005

(51) Int. Cl.
*H01L 21/302* (2006.01)
(52) U.S. Cl. ............... 438/734; 438/142; 438/411; 438/421; 438/694; 438/700; 438/703; 438/749
(58) Field of Classification Search ............ 438/142, 438/275, 411, 421, 694, 700, 703, 734, 749
See application file for complete search history.

(56) References Cited

U.S. PATENT DOCUMENTS

| 6,537,894 B1 * | 3/2003 | Skotnicki et al. .......... 438/424 |
| 6,713,356 B1 * | 3/2004 | Skotnicki et al. .......... 438/285 |
| 2004/0235262 A1 * | 11/2004 | Lee et al. .................. 438/411 |

FOREIGN PATENT DOCUMENTS

| FR | 2799307 | * | 4/2001 |
| WO | WO200057480 | * | 9/2000 |

OTHER PUBLICATIONS

"Silicon On Nothing (SON)-Fabrication, Material and Devices"; Proceedings-Electrochemical Society vol. 2001-3; (2001') pp. 391-402; Skotnicki.*
M. Jurczak et al., *SON (Silicon on Nothing)—A New Device Architecture for the ULSI Era*, VLSI Tech. Dig., p. 29, (1999).
R. Koh, *Buried Layer Engineering to Reduce the Drain-Induced Barrier Lowering of Sub-0.05um SOI-MOSFET* Jpn. J. Appl. Phys., vol. 38, p. 2294 (1999).
M. Jurczak, et al., *Silicon-on-Nothing (SON)—an innovative Process for Advanced CMOS*, IEEE Trans. El. Dev. Vol. 47, pp 2179-2187 (2000).
R. Chau et al., *A 50 nm Depleted-Substrate CMOS Transistor*, IEDM, p. 621, 2001.
T. Sato et al., *SON (Silicon on Nothing)MOSFET Using ESS (Empty Space in Silicon) Technique for SoC Application*, IEDM, p. 809, 2001.

* cited by examiner

*Primary Examiner*—George A. Goudreau
(74) *Attorney, Agent, or Firm*—Robert D. Varitz, PC (57) ABSTRACT

A method for fabrication of silicon-on-nothing (SON) MOSFET using selective etching of $Si_{1-x}Ge_x$ layer, includes preparing a silicon substrate; growing an epitaxial $Si_{1-x}Ge_x$ layer on the silicon substrate; growing an epitaxial thin top silicon layer on the epitaxial $Si_{1-x}Ge_x$ layer; trench etching of the top silicon and $Si_{1-x}Ge_x$, into the silicon substrate to form a first trench; selectively etching the $Si_{1-x}Ge_x$ layer to remove substantially all of the $Si_{1-x}Ge_x$ to form an air gap; depositing a layer of $SiO_2$ by CVD to fill the first trench; trench etching to from a second trench; selectively etching the remaining $Si_{1-x}Ge_x$ layer; depositing a second layer of $SiO_2$ by CVD to fill the second trench, thereby decoupling a source, a drain and a channel from the substrate; and completing the structure by state-of-the-art CMOS fabrication techniques.

8 Claims, 7 Drawing Sheets

FABRICATION OF SILICON-ON-NOTHING (SON) MOSFET FABRICATION USING SELECTIVE ETCHING OF $SI_{1-x}GE_x$ LAYER

FIELD OF THE INVENTION

This invention relates to high speed CMOS integrated circuits, and specifically to the formation of silicon-on-nothing (SON) devices by forming an air gap through selective etching of a SiGe layer.

BACKGROUND OF THE INVENTION

MOSFET fabricated on silicon on insulator (SOI) substrate provides an advantage for high speed and low power applications because of the low parasitic capacitance and the low body effect present in SOI structures. As CMOS IC technology enters the sub-50 nm range, the silicon channel and the buried oxide thicknesses must be less than 50 nm and 100 nm, respectively, in order to prevent the short channel effect (SCE), as described by R. Koh in *Buried Layer Engineering to Reduce the Drain-Induced Barrier Lowering of Sub-0.05 um SOI-MOSFET* Jpn. J. Appl. Phys., Vol. 38, P. 2294 (1999); and R. Chau et al., *A 50 nm Depleted-Substrate CMOS Transistor*, IEDM, p. 621, 2001.

Many techniques have been used for SOI wafer fabrication. Among them, Separation by implaritation of oxygen (SIMOX) and SmartCut™ are considered to be the most promising for high density CMOS ICs. For CMOS technology in the sub-50 nm realm, the silicon channel and the buried oxide thicknesses need to be much less than 50 nm and 100 nm, respectively, in order to prevent the short channel effect (SCE). A super SOI, having a silicon film thickness of five nanometers and a buried oxide thickness of 20 nm might be capable of suppressing the SCE at the CMOS down-scale limit of 20 nm channel length, however, the requirements for the exceptionally thin silicon and buried oxide films exceed present manufacturing capabilities for SOI wafers.

To further improve the device performance, the buried oxide may be replaced with an insulator having a lower dielectric constant. The lowest dielectric constant for the insulator is "1," meaning that an air gap is present under the silicon layer, which leads to the nomenclature of silicon-on-nothing (SON). SON device simulation for theoretical devices demonstrates an improved performance over SOI devices with buried oxide, having a dielectric constant of 3.9. See R. Koh, supra.

Various SON device fabrication processes have been proposed wherein the source and drains regions are connected to the substrate. Although such devices demonstrate improved performance, the structure of such devices may lead to higher parasitic source and drain capacitances, and pose a potential concern regarding subsurface puchthrough. See M. Jurczak et al., *SON (Silicon on Nothing)—A New Device Architecture for the ULSI Era*, VLSI Tech. Dig., p. 29, 1999; M. Jurczak, et al., *Silicon-on-Nothing (SON)—an innovative Process for Advanced CMOS*, IEEE Trans. El. Dev. Vol. 47, pp2179–2187 (2000); and T. Sato et al., *SON (Silicon on Nothing) MOSFET Using ESS (Empty Space in Silicon) Technique for SoC Application*, IEDM, p. 809, 2001.

Figure 1:
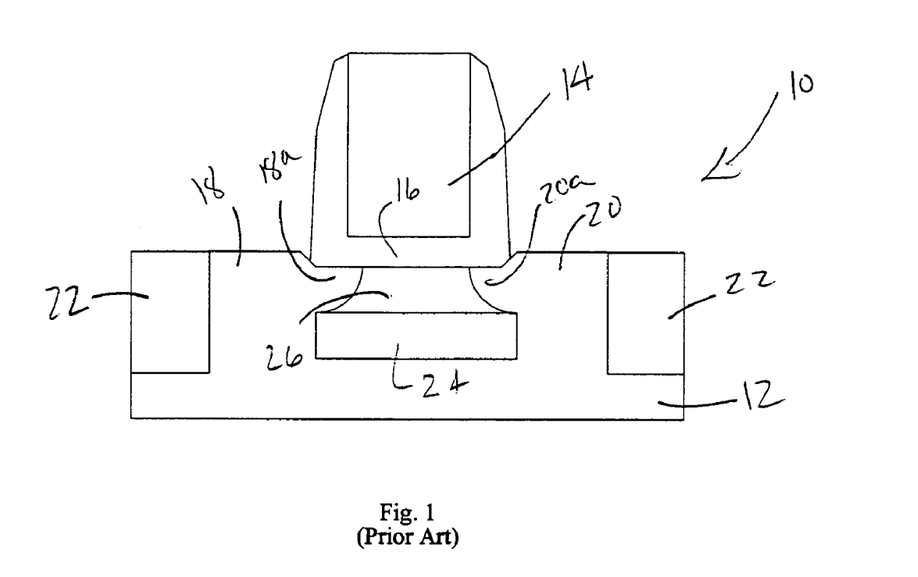
FIGS. 1 and 2 depict a prior art air gap SON device.
Figure 2:
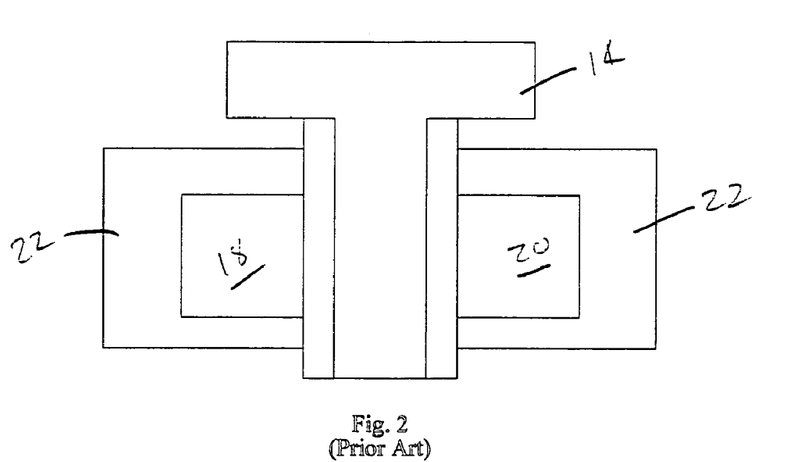

FIG. 1 depicts a prior art SON device, generally at 10, formed on a substrate 12, which includes a gate electrode 14, a gate dielectric 16, a source 18, and a drain 20, which extend through the device channel, and a source extension 18*a* and a drain extension 20*a*. Device 10 is isolated by trench isolation 22 and is 'floated' on an air gap 24. However, air gap 24 is limited to the device channel 26, source extension 18*a* and drain extension 20*a*. Source 18 and drain 20 are still connected to substrate 12. FIG. 2 depicts a top plan view of device 10.

SUMMARY OF THE INVENTION

A method for fabrication of silicon-on-nothing (SON) MOSFET using selective etching of $Si_{1-x}Ge_x$ layer, includes preparing a silicon substrate; growing an epitaxial $Si_{1-x}Ge_x$ layer on the silicon substrate; growing an epitaxial thin top silicon layer on the epitaxial $Si_{1-x}Ge_x$ layer; trench etching of the top silicon and $Si_{1-x}Ge_x$, into the silicon substrate to form a first trench; selectively etching the $Si_{1-x}Ge_x$ layer to remove substantially all of the $Si_{1-x}Ge_x$ to form an air gap; depositing a layer of $SiO_2$ by CVD to fill the first trench; trench etching to from a second trench; selectively etching the remaining $Si_{1-x}Ge_x$ layer; depositing a second layer of $SiO_2$ by CVD to fill the second trench, thereby decoupling a source, a drain and a channel from the substrate; and completing the structure by state-of-the-art CMOS fabrication techniques.

It is an object of the invention to provide a decoupled source, drain and channel from the substrate.

Another object of the invention is to provide the formation of an air gap by selective etching of a SiGe layer.

A further object of the invention is to provide a decoupled source, drain and channel from the substrate through formation of an air gap by selective etching of a SiGe layer, thereby forming a silicon on nothing structure.

Another object of the invention is to fabricated CMOS devices on thin and defect-free silicon on nothing (SON).

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

In the method of the invention, an epitaxial $Si_{1-x}Ge_x$ layer is formed on a silicon substrate. A thin silicon layer, e.g., less than 100 nm, is epitaxially deposited on the $Si_{1-x}Ge_x$ on the silicon substrate. Because of the lattice mismatch between the silicon and $Si_{1-x}Ge_x$ the thickness of $Si_{1-x}Ge_x$ has to be less than the critical thickness of $Si_{1-x}Ge_x$ so that no relaxation occurs and no defects form. After trench etching of the top silicon and $Si_{1-x}Ge_x$ into the silicon substrate to form a first trench, the $Si_{1-x}Ge_x$ layer is selectively removed by etching. The etching time is controlled so that some SiGe remains on the smallest features of the structure to prevent lifting of the silicon. A layer of $SiO_2$ is then deposited by CVD to fill the first trench. A second trench etch step and selective etching of the $Si_{1-x}Ge_x$ layer follows. The $SiO_2$ layer deposited by CVD after the first selective $Si_{1-x}Ge_x$ etch anchors the silicon island in place during the second selective $Si_{1-x}Ge_x$ etch. A second layer of $SiO_2$ is deposited by CVD to fill the second trench. Conventional CMOS techniques may then be applied to complete a thin SON device. In the method of the invention, all of the $Si_{1-x}Ge_x$ layer is removed, and the source/drain and the channel region are all electrically decoupled from the substrate by the air gap formed by removal of the SiGe layer.

Figure 3:
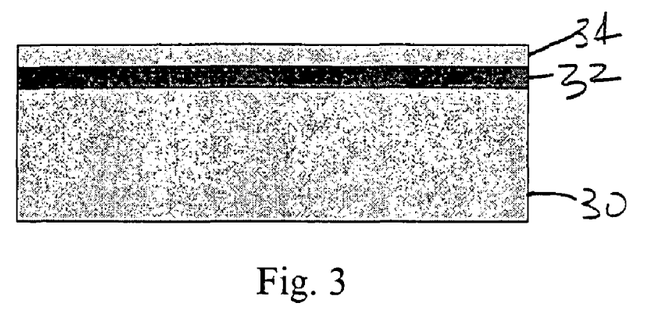
FIGS. 3 to 14 depict successive steps in practicing the method of the invention.

Referring now to FIG. 3, a silicon wafer 30, which is a single crystal substrate, is prepared for fabrication of the device of the method of the invention. A layer of SiGe 32 is formed by epitaxial growth. The SiGe of layer 32 has a Ge content of between about 10% to 80%. The thickness of layer 32 must be less than the critical thickness so that no relaxation occurs in layer 32, and most preferably between 3 nm and 50 nm. A silicon layer 34 is formed by epitaxial growth on top of SiGe layer 32. The thickness of silicon layer 34 should be between about 3 nm to 100 nm, and is determined by device requirements.

Figure 4:
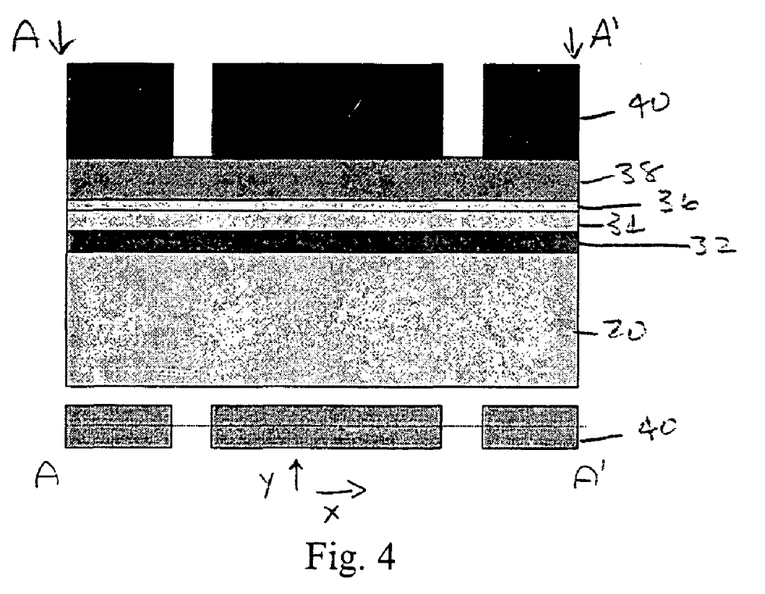

Turning now to FIG. 4, a gate dielectric layer 36 is formed, likely by CVD or thermal oxidation of silicon. A cap layer of polysilicon 38 may be deposited, by CVD, in the case where the device is to be a gate polysilicon device, or, the cap layer may be polysilicon, silicon dioxide or silicon nitride, used as a CMP stopping layer, in the fabrication of a metal gate device. The active area is defined by a two-step shallow trench isolation (STI) process, which differs from conventional one-step STI processes. The layout of the active layer is similar to that formed in a one-step STI process, however, in the preferred embodiment of the method of the invention, a minimum design rule is used in one direction, e.g., the y-direction, on every polygon in the layout. In the first STI process, photoresist 40 is applied and the first STI etch step is performed in the fabrication of the first STI process photo mask, the active layer is elongated along the longer side of the polygon, e.g., the x-direction, on both ends by a fixed amount. If the two active regions are too close to each other in the x-direction, they can be merged. Section A–A' depicts the photo mask configuration.

Figure 5:
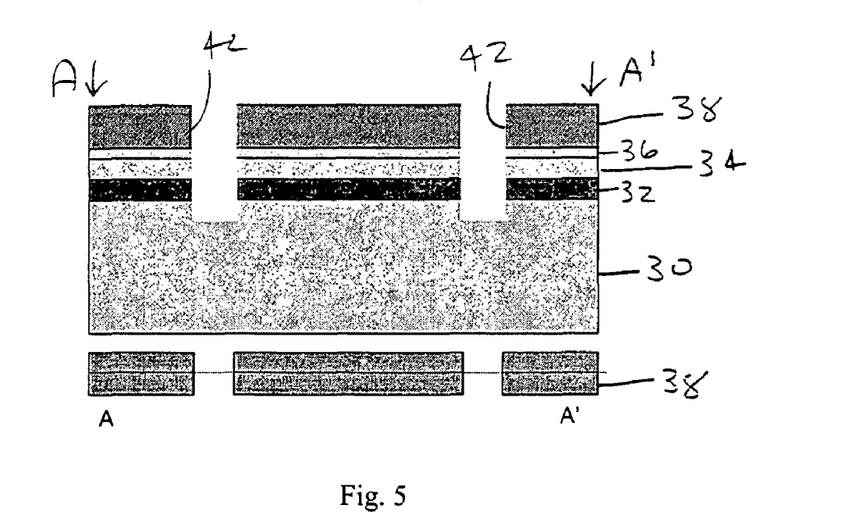

As shown in FIG. 5, the STI etch depth results in a first trench 42, which may extend below SiGe layer 32 by as little as 10 nm. Because the device is fabricated on top silicon layer 34, and because SiGe layer 32 ultimately will be replaced by air, deep isolation is not required. FIG. 5, Section A–A' depicts a top plan view of the section of FIG. 5

Figure 6:
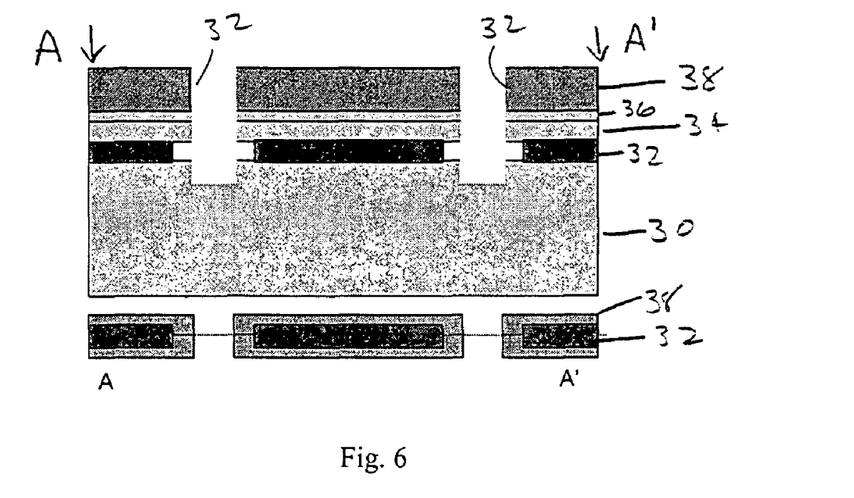

FIG. 6 depicts the structure following a selective SiGe wet etch. A mixture of ammonia hydroxide and hydrogen peroxide, applied at an elevated temperature, e.g., between about 25° C. and 100° C., may be used for selective SiGe etch. A plasma dry etch may also be applied in place of the wet etch, as described in Jurczak et al., supra. The SiGe-to-silicon etching selectivity may be improved by providing SiGe layer 32 with a higher Ge content. Section A–A' illustrates the amount of SiGe layer 32 removed relative to polysilicon layer 38. Trench 42 is slightly expanded at the level of SiGe layer 32. The portion of SiGe layer 32 remaining in the structure now fixes, or anchors, top silicon layer 34.

Figure 7:
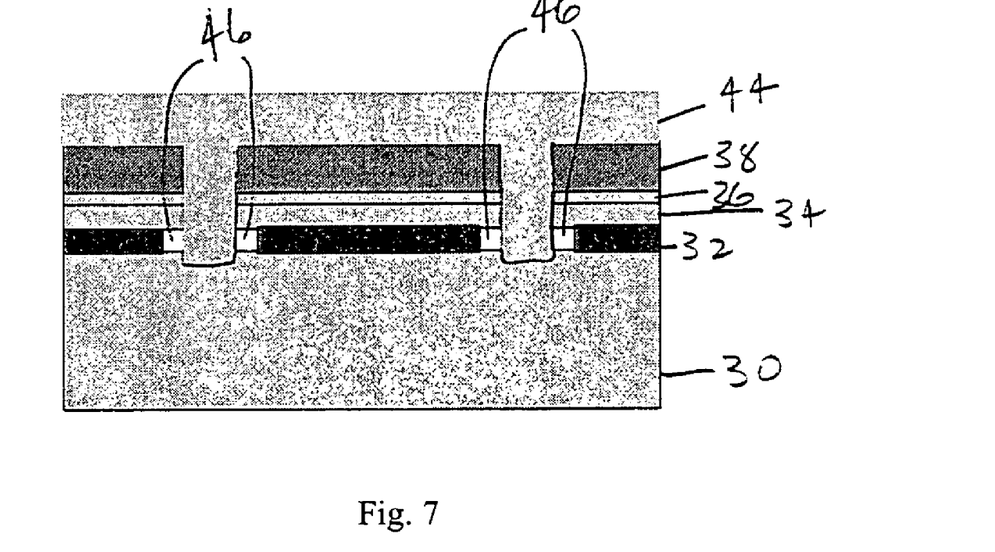

Referring now to FIG. 7, first trench 42 is filled with oxide 44. High density plasma, (HDP) CVD of $SiO_2$ may be used for this bottom-up trench fill.

Figure 8:
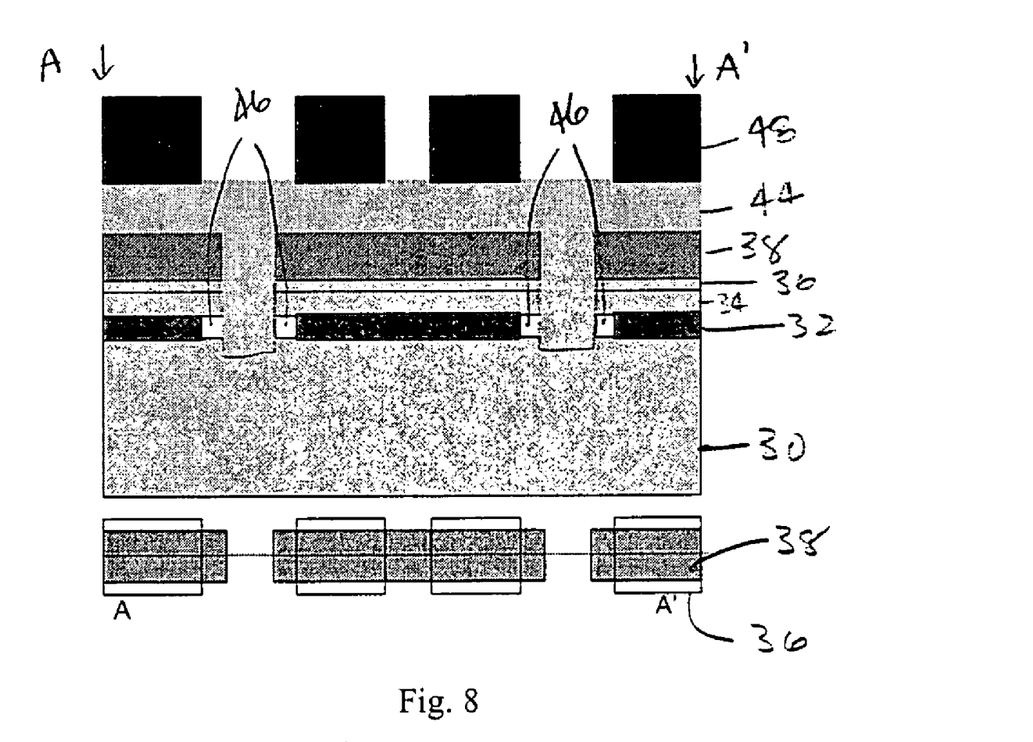

FIG. 8 depicts the second STI etch step, including patterning of photoresist 48. This time, the active layer is elongated on both ends by a fixed length in the y-direction by a logical operation in mask fabrication. Section A–A' depicts the first and second masks used in the first and second STI steps, respectively. The overlap of the first and second STI mask layers defines the active region.

Figure 9:
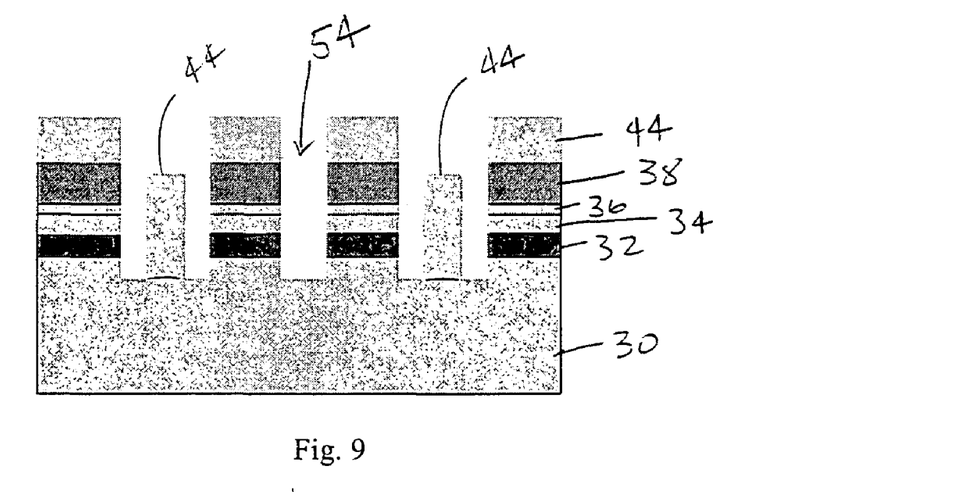

The second STI etching step is depicted in FIG. 9, which leaves the remains of oxide layer 44. A second trench 54 is formed during the second STI etching step. The STI etch is highly selective between silicon and silicon oxide, so that the first layer of silicon oxide remains intact and anchors silicon film 34 during the SiGe etching step.

Figure 10:
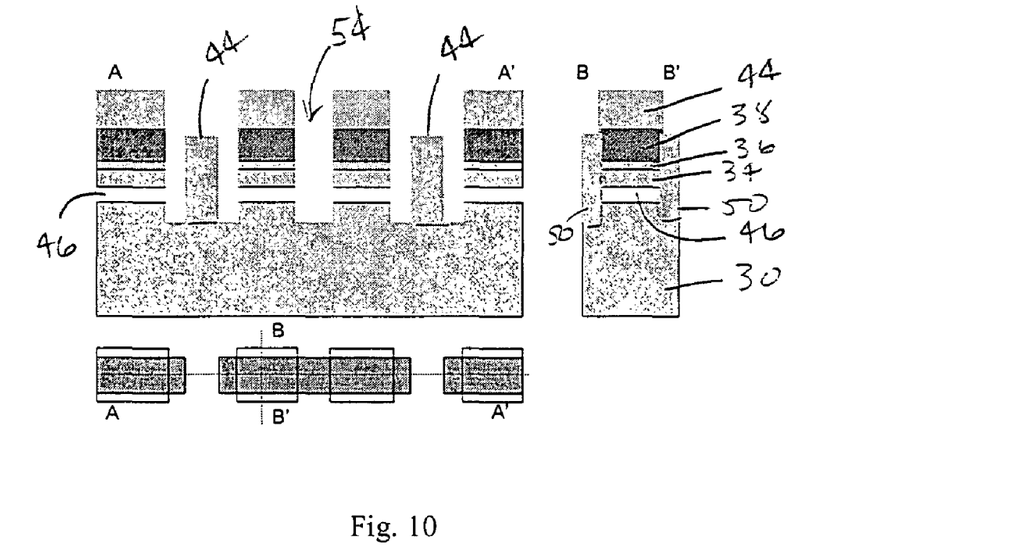

FIG. 10 depicts the structure following removal of SiGe layer 32, which is completely removed by selective etching, leaving top silicon layer 34, and any overlaying layers, supported by oxide plugs 50, as shown Section B–B'. A thermal oxidation process is applied to passivate silicon layer 34 and silicon substrate 30. Air gap 46 remains, and occupies the space previously occupied by SiGe layer 32. Another technique for this step is to oxidize the silicon, allowing the thermal oxide to fill air gap 46, when the device is fabricated on SOI.

Figure 11:
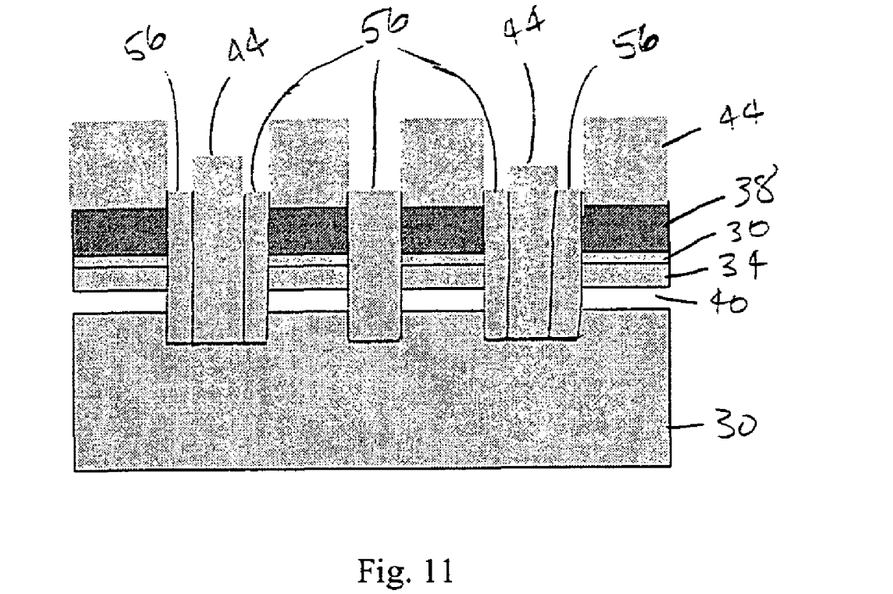
Figure 12:
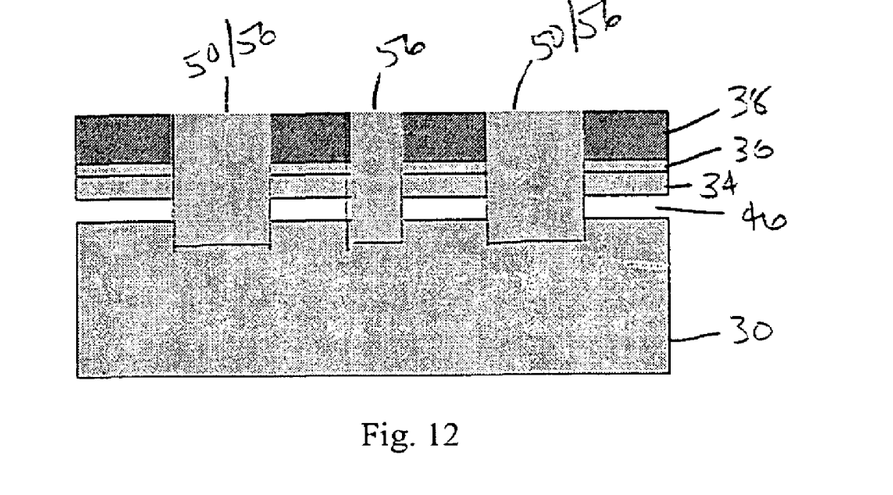

FIG. 11 depicts filling of trench 54 with oxide 56. The structure is polished by CMP, to remove the various oxide portions, stopping at the level of polysilicon 38, as shown in FIG. 12.

Figure 13:
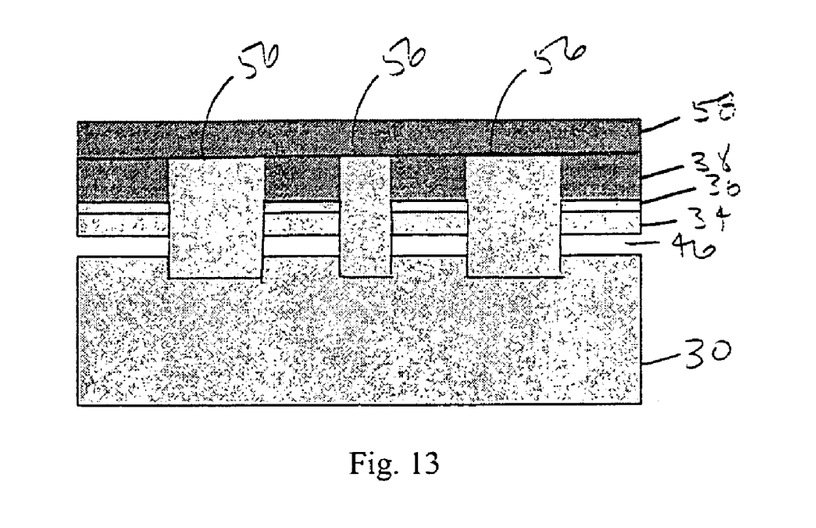
Figure 14:
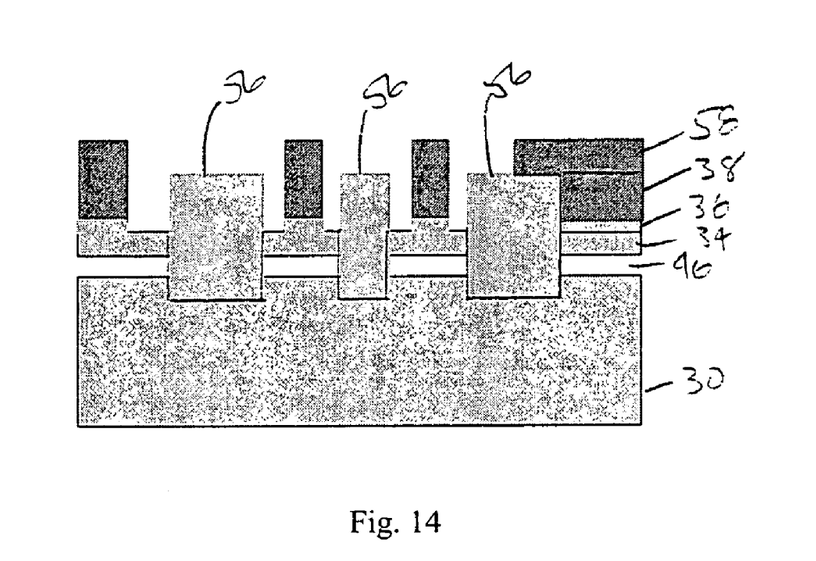

FIG. 13 depicts deposition of a second polysilicon layer 58, which is followed by application and patterning of photoresist, and etching, resulting in the transistor structure of FIG. 14.

After the polysilicon gate is formed, the device may be completed by state-of-the-art CMOS process technology. Because thin silicon layer 24 is located on the source/drain area, a raised source/drain technology may apply to reduce the transistor's series resistance.

Thus, a method for fabrication of silicon-on-nothing (SON) MOSFET fabrication using selective etching of $Si_{1-x}Ge_x$ layer has been disclosed. It will be appreciated that further variations and modifications thereof may be made within the scope of the invention as defined in the appended claims.

We claim:

1. A method for fabrication of silicon-on-nothing (SON) MOSFET using selective etching of $Si_{1-x}Ge_x$ layer, comprising:

preparing a silicon substrate;

growing an epitaxial $Si_{1-x}Ge_x$ layer on the silicon substrate;

growing an epitaxial thin top silicon layer on the epitaxial $Si_{1-x}Ge_x$ layer;

trench etching of the top silicon and $Si_{1-x}Ge_x$, into the silicon substrate to form a first trench;

selectively etching the $Si_{1-x}Ge_x$ layer to remove a portion of the $Si_{1-x}Ge_x$ to form an air gap;

depositing a layer of $SiO_2$ by CVD to fill the first trench;

trench etching to from a second trench;

selectively etching the remaining $Si_{1-x}Ge_x$ layer;

depositing a second layer of $SiO_2$ by CVD to fill the second trench, thereby decoupling a source, a drain and a channel from the substrate; and completing the structure by state-of-the-art CMOS fabrication techniques.

2. The method of claim 1 wherein the thickness of $Si_{1-x}Ge_x$ is less than the critical thickness of between about 3 nm to 100 nm of $Si_{1-x}Ge_x$ so that no relaxation occurs and no defects form in the $Si_{1-x}Ge_x$ layer.

3. The method of claim 1 where the etching time is controlled during the first etching step so that some SiGe remains on the smallest features of the structure to prevent lifting of the top silicon layer.

4. The method of claim 1 wherein said growing an epitaxial $Si_{1-x}Ge_x$ layer on the silicon substrate includes growing a $Si_{1-x}Ge_x$ layer having a Ge content of between about 10% to 80%.

5. The method of claim 1 wherein said growing an epitaxial thin top silicon layer, on the epitaxial $Si_{1-x}Ge_x$ layer includes growing a silicon layer having a thickness of between about 3 nm to 100 nm.

6. A method for fabrication of silicon-on-nothing (SON) MOSFET using selective etching of $Si_{1-x}Ge_x$ layer, comprising:

preparing a silicon substrate;

growing an epitaxial $Si_{1-x}Ge_x$ layer on the silicon substrate, wherein the thickness of $Si_{1-x}Ge_x$ is between about 3 nm to 100 nm $Si_{1-x}Ge_x$ so that no relaxation occurs and no defects form in the $Si_{1-x}Ge_x$ layer;

growing an epitaxial thin top silicon layer on the epitaxial $Si_{1-x}Ge_x$ layer;

trench etching of the top silicon and $Si_{1-x}Ge_x$, into the silicon substrate to from a first trench;

selectively etching the $Si_{1-x}Ge_x$ layer to remove a portion of the $Si_{1-x}Ge_x$ to form an air gap;

depositing a layer of $SiO_2$ by CVD to fill the first trench;

trench etching to from a second trench;

selectively etching the remaining $Si_{1-x}Ge_x$ layer; and depositing a second layer of $SiO_2$ by CVD to fill the second trench, thereby decoupling a source, a drain and a channel from the substrate.

7. The method of claim 6 where the etching time is controlled during the first etching step so that some SiGe remains on the smallest features of the structure to prevent lifting of the top silicon layer.

8. The method of claim 6 wherein said growing an epitaxial $Si_{1-x}Ge_x$ layer on the silicon substrate includes growing a $Si_{1-x}Ge_x$ layer having a Ge content of between about 10% to 80%.

* * * * *